United States Patent
Ku et al.

(10) Patent No.: US 10,497,557 B2
(45) Date of Patent: Dec. 3, 2019

(54) INTEGRATED PLATFORM FOR IMPROVED WAFER MANUFACTURING QUALITY

(71) Applicant: Taiwan Semiconductor Manufacturing Co. Ltd., Hsin-Chu (TW)

(72) Inventors: Shao-Yen Ku, Jhubei (TW); Tsai-Pao Su, Donggang Township (TW); Wen-Chang Tsai, Hsinchu (TW); Chia-Wen Li, Hsinchu (TW); Yu-Yen Hsu, Zhudong Township (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 658 days.

(21) Appl. No.: 14/717,089

(22) Filed: May 20, 2015

(65) Prior Publication Data
US 2015/0255270 A1 Sep. 10, 2015

Related U.S. Application Data

(62) Division of application No. 13/778,448, filed on Feb. 27, 2013.

(51) Int. Cl.
*H01L 21/02* (2006.01)
*H01L 21/67* (2006.01)
*H01L 21/306* (2006.01)

(52) U.S. Cl.
CPC ...... *H01L 21/02057* (2013.01); *H01L 21/306* (2013.01); *H01L 21/67028* (2013.01); *H01L 21/67161* (2013.01); *H01L 21/67207* (2013.01)

(58) Field of Classification Search
CPC ............... H01L 21/67184; H01L 21/6723
See application file for complete search history.

(56) References Cited

U.S. PATENT DOCUMENTS

| | | | |
|---|---|---|---|
| 6,467,491 B1 | 10/2002 | Sugiura et al. | |
| 6,566,269 B1 | 5/2003 | Biles et al. | |

(Continued)

FOREIGN PATENT DOCUMENTS

| | | |
|---|---|---|
| KR | 20080082260 A | 9/2008 |
| WO | 03041149 A1 | 5/2003 |

OTHER PUBLICATIONS

Office Action dated Jun. 26, 2014 Korean Patent Application No. 10-2013-0073654.

(Continued)

*Primary Examiner* — Parviz Hassanzadeh
*Assistant Examiner* — Nathan K Ford
(74) *Attorney, Agent, or Firm* — Eschweiler & Potashnik, LLC

(57) ABSTRACT

The present disclosure relates to a method and apparatus for performing a dry plasma procedure, while mitigating internal contamination of a semiconductor substrate. In some embodiments, the apparatus includes a semiconductor processing tool having a dry process stage with one or more dry process elements that perform a dry plasma procedure on a semiconductor substrate received from an input port. A wafer transport system transports the semiconductor substrates from the dry process stage to a wet cleaning stage located downstream of the dry process stage. The wet cleaning stage has one or more wet cleaning elements that perform a wet cleaning procedure to remove contaminants from a surface of the semiconductor substrates before the semiconductor substrate is provided to an output port, thereby improving wafer manufacturing quality.

20 Claims, 4 Drawing Sheets

(56) References Cited

U.S. PATENT DOCUMENTS

| | | |
|---|---|---|
| 6,913,654 B2 | 7/2005 | Alvarez, Jr. et al. |
| 7,159,599 B2 | 1/2007 | Verhaverbeke et al. |
| 7,189,291 B2 | 3/2007 | Spiegelman et al. |
| 7,210,246 B2 * | 5/2007 | van der Meulen ...... B25J 9/042 34/403 |
| 2003/0106642 A1 * | 6/2003 | Fairbairn ............ G03F 7/70558 156/345.24 |
| 2008/0057221 A1 * | 3/2008 | Boyd .................... H01L 21/288 427/569 |
| 2008/0102200 A1 | 5/2008 | Doki et al. |
| 2008/0219812 A1 * | 9/2008 | van der Meulen .......................... H01L 21/67161 414/217 |
| 2012/0051872 A1 | 3/2012 | Ku et al. |

OTHER PUBLICATIONS

Non-Final Office Action dated Apr. 24, 2014 for U.S. Appl. No. 13/778,448.
Final Office Action dated Oct. 23, 2014 for U.S. Appl. No. 13/778,448.
Notice of Allowance dated Feb. 23, 2015 for U.S. Appl. No. 13/778,448.

\* cited by examiner

INTEGRATED PLATFORM FOR IMPROVED WAFER MANUFACTURING QUALITY

REFERENCE TO RELATED APPLICATION

This application is a divisional of U.S. application Ser. No. 13/778,448 filed on Feb. 27, 2013, now U.S. Pat. No. 9,064,807, the contents of which are incorporated by reference in their entirety.

BACKGROUND

Modern day integrated chips comprise millions or billions of semiconductor devices formed on a semiconductor substrate (e.g., silicon). To improve functionality of integrated chips, the semiconductor industry has continually reduced the dimension of semiconductor devices to provide for integrated chips with small, density populated devices. By forming integrated chips having small, densely populated devices, the speed of the semiconductor devices increases as the power consumption of devices decreases. However, as the density of integrated chip devices increases, the failure rate of integrated chips due to contamination also goes up. One cause of such increasing failures is the exposure of a wafer to airborne molecular contaminants (e.g., dust particles in the air).

To minimize integrated chip failure due to contaminants, exposure of an integrated chip to contaminant particles is limited. For example, modern day integrated chips are formed in clean rooms having a low level of environmental pollutants. For example, an ISO 1 cleanroom contains no particles having a size of greater than or equal to 0.5 um (in comparison to ambient air outside, which contains approximately 35,000,000 particles per cubic meter in that size). Integrated chips are also transported between tools in a clean room using closed wafer carriers (e.g., front-opening unified pods) that further decrease exposure of an integrated chip to contaminants.

DETAILED DESCRIPTION

Figure 1:
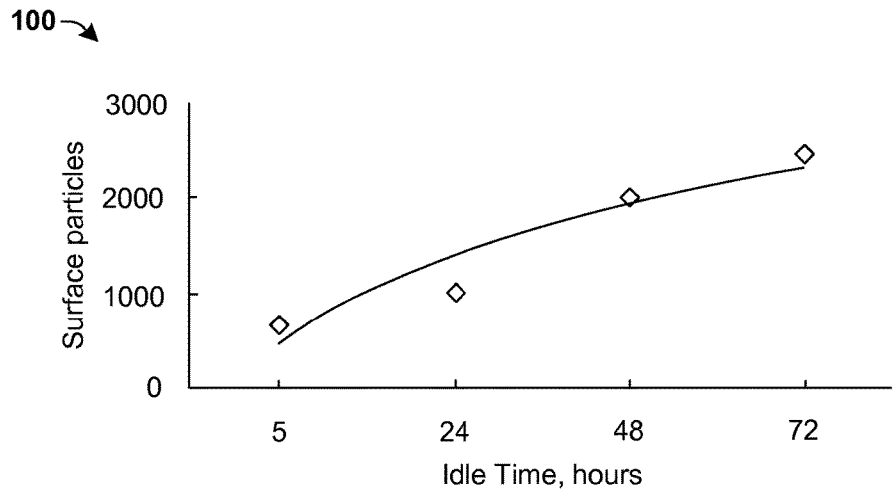
FIG. 1 illustrates a graph illustrating the surface contamination of a wafer as a function of Q-time.

The description herein is made with reference to the drawings, wherein like reference numerals are generally utilized to refer to like elements throughout, and wherein the various structures are not necessarily drawn to scale. In the following description, for purposes of explanation, numerous specific details are set forth in order to facilitate understanding. It will be appreciated that the details of the figures are not intended to limit the disclosure, but rather are non-limiting embodiments. For example, it may be evident, however, to one of ordinary skill in the art, that one or more aspects described herein may be practiced with a lesser degree of these specific details. In other instances, known structures and devices are shown in block diagram form to facilitate understanding.

Despite the low number of contaminant particles in a fabrication clean room, contamination of integrated chips cannot be completely prevented. Some fabrication processes release internal contaminants directly onto a wafer, which cannot be prevented by cleanroom procedures. For example, dry etching procedures result in surface haloid polymer residues that are a major source of internal contaminants. It has been appreciated that moisture within a closed system can aggravate the effect of such internal contaminants and present further problems for semiconductor reliability. For example, moisture within a front opening unified pod (FOUP) can reduce particle removal efficiency and accelerate reactions of wafer surface haloid polymer residues resulting in condensed defects on a wafer surface or corrosion of copper metal lines.

To prevent contamination by internal contaminants, many modern day IC fabrication processes control 'Q-time', which is the time the wafer is exposed to open air. With increased Q-time, the thickness of an oxide layer and the number of surface particles to which the wafer is exposed increases, thereby also increasing a likelihood of integrated chip failure. For example, FIG. 1 is a graph 100 illustrating the surface contamination of a wafer (y-axis) as a function of Q-time (x-axis). As shown in graph 100, as the Q-time of a wafer increases, the number of surface particles that the wafer is exposed to increases, which can reduce the yield of integrated chips formed on the wafer.

Accordingly, the present disclosure relates to a semiconductor processing tool that has a dry process element integrated with a wet cleaning element to provide semiconductor substrates free of surface contamination. In some embodiments, the semiconductor tool includes a dry process stage having one or more dry process elements configured to perform a dry plasma procedure on a semiconductor substrate received from an input port. A wafer transport system is configured to transport the semiconductor substrate from the dry process stage to a wet cleaning stage located downstream of the dry process stage. The wet cleaning stage includes one or more wet cleaning elements configured to perform a wet cleaning procedure to remove contaminants from a surface of the semiconductor substrate before the semiconductor substrate is provided to an output port. By performing a wet cleaning procedure prior to providing the semiconductor substrates to the output port, internal contaminants from the dry plasma procedure are removed from the semiconductor substrate and manufacturing quality is improved.

Figure 2:
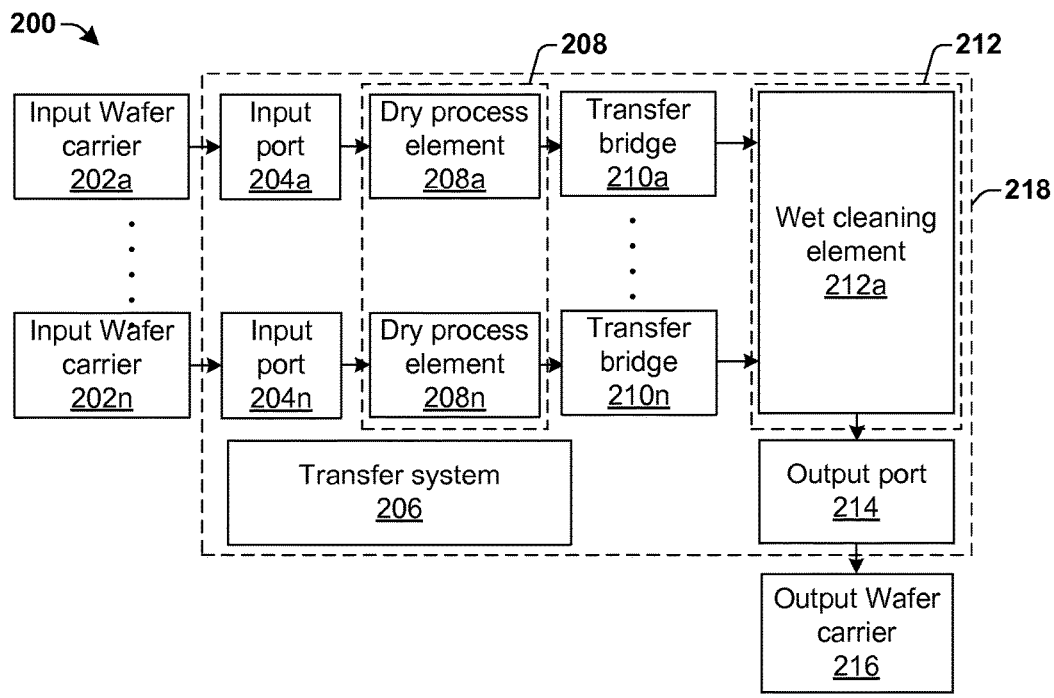
FIG. 2 illustrates a block diagram of some embodiments of a disclosed semiconductor processing tool including a dry etching element integrated with a wet cleaning element.

FIG. 2 illustrates a block diagram of some embodiments of a disclosed semiconductor processing tool 200 having a dry process stage 208 integrated with a wet cleaning stage 212 within a platform housing 218.

The semiconductor processing tool 200 includes one or more input ports 204a, ..., 204n configured to receive a semiconductor substrate. In some embodiments, input ports 204a, ..., 204n are configured to couple to an input wafer carrier 202a, ..., 202n configured to hold one or more semiconductor substrates. For example, a first input port 204a is configured to couple to a first input wafer carrier 202a, a second input port 204b is configured to couple to a second input wafer carrier 202b, etc. In some embodiments, the input wafer carriers 202a, ..., 202n are front opening unified pods (FOUPs) containing one or more semiconductor substrates. In some embodiments, the one or more semiconductor substrates may be 450 mm semiconductor wafers. A wafer transfer system 206 is configured to transfer a semiconductor substrate from an input wafer carrier 202a, ..., or 202n to a dry process stage 208 including a plurality of dry process elements 208a, ..., 208n. In some embodiments, wafer transfer system 206 is configured to transfer a semiconductor substrate from an input port 204a, ..., or 204n to an associated dry process element, 208a, ..., or 208n. For example, the wafer transfer system 206 is configured to transfer a first semiconductor substrate from a first input wafer carrier 202a coupled to a first input port 204a to a first dry process element 208a, to transfer a second semiconductor substrate from a second input wafer carrier 202b coupled to a second input port 204b to a second dry process element 208b, etc. In some embodiments, the wafer transfer system 206 includes multiple robotic elements configured to handle the semiconductor substrates during transfer from an input wafer carrier 202a, ..., or 202n to the dry process stage 208.

Respective dry process elements 208a, ..., 208n are configured to perform a dry plasma procedure on a received semiconductor substrate. In some embodiments, respective dry process elements 208a, ..., 208n may include plasma etching elements configured to perform a plasma etching procedure, a reactive ion etching (RIE) element configured to perform an RIE procedure, or a plasma ashing element configured to perform a plasma ashing procedure, for example. In some embodiments, the plurality of dry process elements 208a, ..., 208n may be configured to perform different plasma processes, such as dry etching and plasma ashing. For example, in some embodiments, a first dry process element 208a is configured to perform a dry etching process, while a second dry process element 208b is configured to perform a plasma ashing process. In some embodiments, one or more of the plurality dry process elements (e.g., 208a) may be configured to perform multiple plasma processes (e.g., both dry etching and plasma ashing).

The wafer transfer system 206 is further configured to transfer the semiconductor substrates from the dry process stage 208 to a wet cleaning stage 212 by way of transfer bridges 210a, ..., 210n. The transfer bridges 210a, ..., 210n are configured to prevent the semiconductor substrates from being exposed to an ambient environment and to maintain a vacuum within a processing chamber of the dry process elements 208a, ..., 208n.

The wet cleaning stage 212 includes one or more wet cleaning elements 212a located downstream of one or more dry process elements 208a, ..., 208n. The one or more wet cleaning elements 212a are configured to perform a wet cleaning procedure on a received semiconductor substrate that removes contaminants (e.g., particles, metal contaminants, organic contaminants, etc.) from the semiconductor substrate by way of a cleaning process that uses a liquid cleaner. In some embodiments, the wet cleaning procedure may include an RCA cleaning, in which hydrogen peroxide solutions having a high pH are used for effective removal of organic compounds from the semiconductor substrate (by oxidation). In other embodiments, the wet cleaning procedure may include other cleaning procedures, such as an HF cleaning, SPM (sulfuric-peroxide mixture) cleaning, ozone in deionized water (O3/DI) cleaning, solvent cleaning, etc., for example.

In some embodiments, the one or more dry process elements 208a, ... 208n, are configured to provide semiconductor substrates to a same wet cleaning element 212a. It will be appreciated that by connecting multiple dry process elements 208a, ..., 208n to a same wet cleaning element 212a, the throughput of the semiconductor processing tool 200 is increased since the throughput of the dry process elements 208a, ..., 208n is lower than the throughput of the wet cleaning element 212a.

The wafer transfer system 206 is further configured to transfer the semiconductor substrate from the wet cleaning stage 212 to an output port 214 comprising an output wafer carrier 216 configured to hold the semiconductor substrate. By transferring the semiconductor substrates from the wet cleaning stage 212 to a output wafer carrier 216 (e.g., a FOUP), the disclosed semiconductor processing tool 200 integrates dry plasma processing and wet cleaning procedures into a single tool that outputs a semiconductor substrate having a surface that is contamination free after the dry plasma process.

Figure 3:
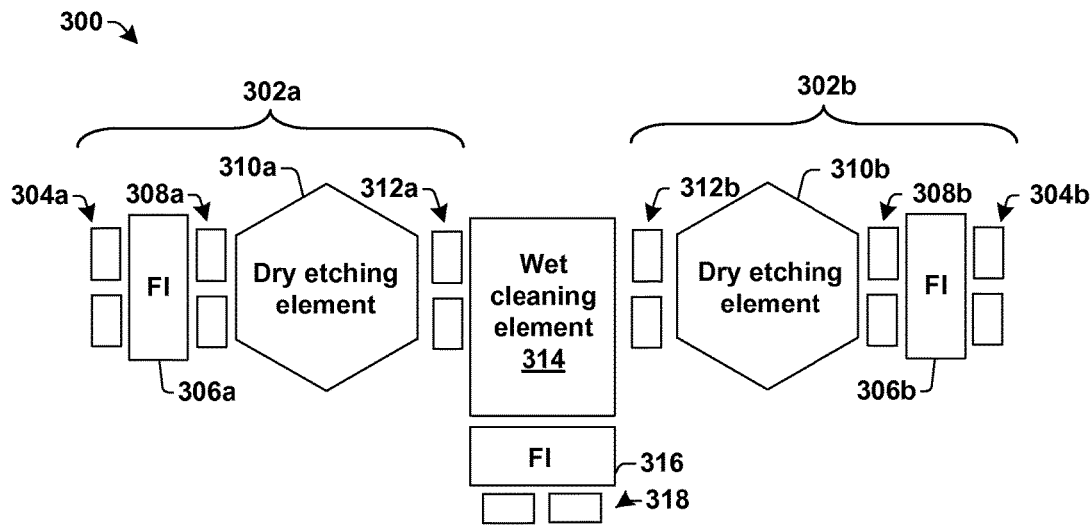
FIG. 3 illustrates a block diagram of some alternative embodiments of a disclosed semiconductor processing tool including a dry etching element integrated with a wet cleaning element.

FIG. 3 illustrates a block diagram of some embodiments of a disclosed semiconductor processing tool 300 comprising one or more dry etching elements 310 integrated with a wet cleaning element 314.

Semiconductor processing tool 300 includes a first dry etching path 302a and a second dry etching path 302b coupled to a wet cleaning element 314. The first and second dry etching paths, 302a and 302b, are configured to receive semiconductor substrates from input wafer carriers, to perform a dry etching procedure on the semiconductor substrates, and to provide the semiconductor substrates to the wet cleaning element 314. The wet cleaning element 314 is configured to remove internal contaminants (e.g., introduced during the dry etching procedures) from the semiconductor substrates before providing the semiconductor substrates to an output wafer carrier.

In some embodiments, respective dry etching paths 302 includes an input port 304 configured to receive a semiconductor substrate (e.g., a semiconductor wafer) from an input wafer carrier (e.g., from a FOUP). The input port 304 is connected to a first factory interface 306. The first factory interface 306 is configured to transfer semiconductor substrates into a first load lock module 308. In some embodiments, the first factory interface 306 is configured to position an input wafer carrier, holding semiconductor substrates, into the first load lock module 308. In some embodiments, the first factory interface 306 is configured to transfer individual semiconductor substrates between an input carrier positioned at the input port 304 and the first load lock module 308.

The first load lock module 308 is positioned between the first factory interface 306 and a dry etching element 310 and is configured to maintain a low pressure within a processing chamber of the dry etching element 310. For example, the first load lock module 308 is configured to operate at a first pressure when receiving a semiconductor substrate, to reduce its pressure to a second pressure less than the first pressure, and to then transport the semiconductor substrate to the processing chamber of the dry etching element 310.

A second load lock module 312 is positioned between the dry etching element 310 and a wet cleaning element 314. The second load lock module 312 is configured to operate as a bridge between the dry etching element 310 and the wet cleaning element 314 that maintains a low pressure within the processing chamber of the dry etching element 310. For example, the second load lock module 312 is configured to operate at a second pressure (e.g., a pressure in the range of mTorr) when receiving a semiconductor substrate, to increase its pressure from the second pressure to a first pressure (e.g., an atmospheric pressure) greater than the second pressure, and then to transport the semiconductor substrate to a processing chamber of the wet cleaning element 314.

The wet cleaning element 314 is configured to receive the semiconductor substrate from the second load lock module 312 and to perform a wet cleaning procedure on the received semiconductor substrate. The wet cleaning procedure removes surface contaminants from the semiconductor substrate to provide for a semiconductor substrate having a surface that is contamination free. For example, in some embodiments, the wet cleaning procedure is configured to remove haloid polymer residues of the dry etching procedure from the semiconductor substrate The wet cleaning element 314 is connected to a second factory interface 316. The second factory interface 316 is configured to transport semiconductor substrates from the wet cleaning element 314 to an output wafer carrier located within an output port 318. In some embodiments, the second factory interface 316 includes a robotic arm configured to transfer individual semiconductor wafers between the wet cleaning element 314 and the output wafer carrier.

Figure 4:
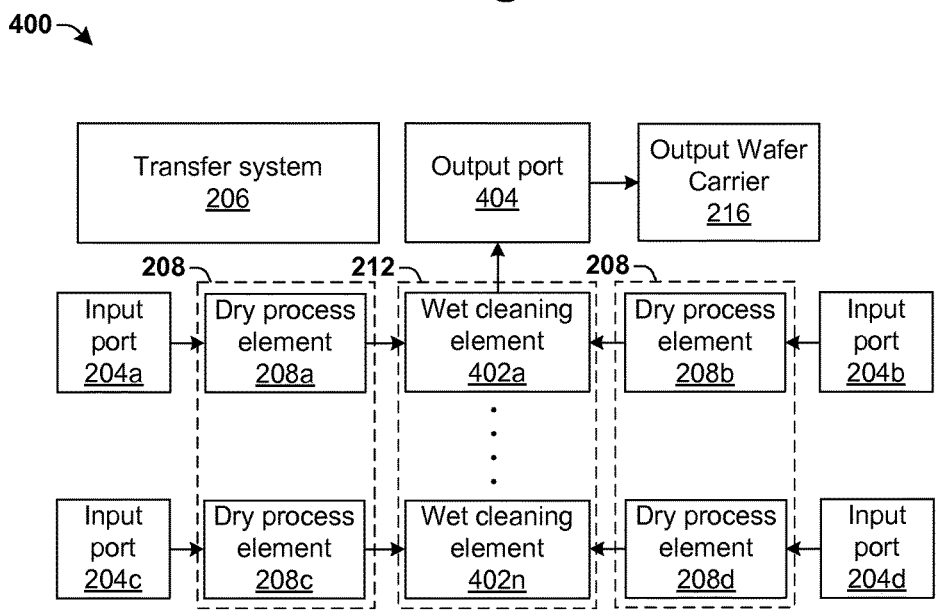
FIG. 4 illustrates a block diagram of some alternative embodiments of a disclosed semiconductor processing tool including a plurality of stacked wet cleaning elements.

Although the disclosed semiconductor processing tools (e.g., tools 300, 500) may be described as comprising particular types of dry process elements (e.g., dry etching tools, plasma ashing tools), it will be appreciated that associated embodiments are not limited to such dry process elements. For example, some embodiments described in relation to semiconductor processing tool 300 may be applied to a semiconductor processing tool comprising one or more plasma ashing elements, for example. Similarly, some embodiments described in relation to semiconductor processing tool 500 may be applied to a semiconductor processing tool comprising one or more plasma ashing elements, for example FIG. 4 illustrates a block diagram of some alternative embodiments of a disclosed semiconductor processing tool 400.

Semiconductor processing tool 400 includes a plurality of wet cleaning elements, 402a, . . . , 402n. Respective wet cleaning elements 402a, . . . , 402n include a wet cleaning processing chamber configured to house a semiconductor substrate during a wet cleaning procedure. The plurality of wet cleaning elements 402a, . . . , 402n are connected to a shared output port 404 that is configured to accept an output wafer carrier 216 configured to receive semiconductor substrates from the plurality of wet cleaning elements, 402a, . . . , 402n. In some embodiments, the plurality of wet cleaning elements, 402a, . . . , 402n, are stacked vertically onto one another so as to form a stacked tower structure with the shared output port 404 at a top of the stacked tower structure.

Respective wet cleaning elements 402a, . . . , 402n are connected to one or more of dry process elements 208a-208d and are configured to receive semiconductor substrates from the one or more dry process elements 208a-208d. For example, a first wet cleaning element 402a is configured to receive semiconductor substrates from a first dry process element 208a and a second dry process element 208b, while a second wet cleaning element 402n is configured to receive semiconductor substrates from a third dry process element 208c and a fourth dry process element 208d.

Although, semiconductor processing tool 400 illustrates respective wet cleaning elements 402 as being connected to two dry process elements, it will be appreciated that respective wet cleaning elements 402a, . . . , 402n may be coupled to any number of dry process elements.

Figure 5:
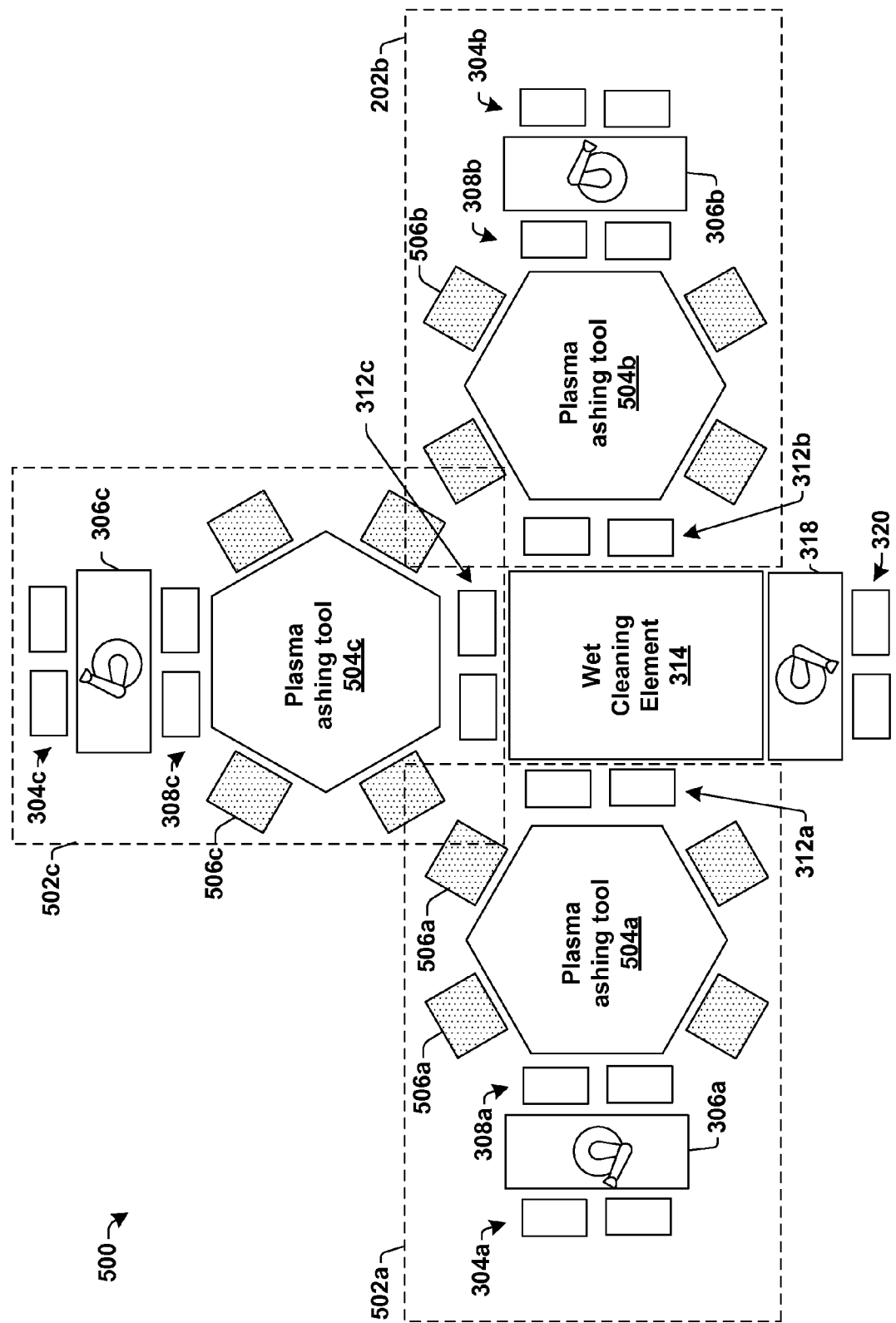
FIG. 5 illustrates a block diagram of some alternative embodiments of a disclosed semiconductor processing tool, wherein the dry etching element includes a plasma ashing tool.

FIG. 5 illustrates a block diagram of some alternative embodiments of a disclosed semiconductor processing tool 500, which includes a plasma ashing tool as the dry process element. Although semiconductor processing tool 500 is illustrated as comprising three plasma ashing tools 504a-504c, it will be appreciated that in some alternative embodiments, semiconductor processing tool 500 may comprise a different number of plasma ashing tools and/or other dry process tools (e.g., dry etching tools)

Semiconductor processing tool 500 includes a first dry processing path 502a, a second dry processing path 502b, and a third dry processing path 502c coupled to a wet cleaning element 314. Although semiconductor processing tool 500 illustrates three dry processing paths, it will be appreciated that the disclosed semiconductor processing tool 500 may include any number of dry processing paths.

Respective dry processing paths 502 include plasma ashing tool 504 comprising one or more ashing elements 506. The ashing elements 506 are configured to generate a plasma that is used to remove photoresist from a semiconductor substrate, so that the plasma ashing tool 504 can perform an ashing process. In some embodiments, ashing elements 506 utilize a mixture of reactive gases, such as atomic oxygen, to remove the photoresist from the surface of the semiconductor substrate.

Figure 6:
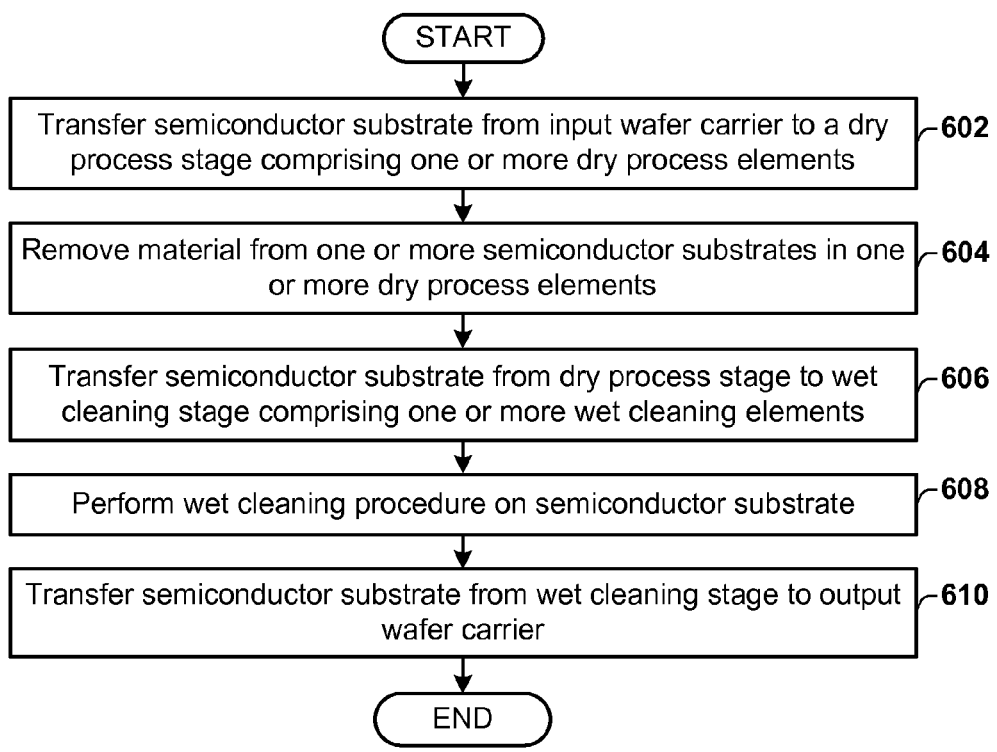
FIG. 6 is a flow diagram of some embodiments of a method of semiconductor processing that performs a dry etching procedure and a subsequent wet cleaning procedure to provide for semiconductor substrates that are free of surface contamination.

FIG. 6 is a flow diagram of some embodiments of a method 600 of semiconductor processing that performs a dry plasma procedure and a subsequent wet cleaning procedure to provide for semiconductor substrates that are free of surface contamination.

While the disclosed method 600 are illustrated and described below as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the description herein. Further, one or more of the acts depicted herein may be carried out in one or more separate acts and/or phases.

At act 602, a semiconductor substrate is transferred from an input wafer carrier to a dry process stage comprising one or more dry process elements. The dry process elements are configured to perform a dry plasma process (e.g., a dry etching process, an ashing process). In some embodiments, the input wafer carrier is a front opening unified pod (FOUP). In some embodiments, the semiconductor substrate is transferred from the input wafer carrier to a dry process element by way of a first load lock module configured to maintain a low pressure environment within a processing chamber of the dry process element.

At act 604, material is removed from the one or more semiconductor substrates in the one or more dry process elements. In some embodiments, the material is removed by performing a dry plasma process on a semiconductor substrate. In various embodiments, the dry plasma process may include a plasma etching process to etch a semiconductor substrate, a reactive ion etching process to etch a semiconductor substrate, an ashing process to remove photoresist from a semiconductor substrate, etc.

At act 606, the semiconductor substrate is transferred from the dry process stage to a wet cleaning stage comprising one or more wet cleaning elements. The one or more wet cleaning elements are configured to perform a wet cleaning procedure that removes contaminants from the semiconductor substrate (e.g., contaminant residue from a dry etching procedure). In some embodiments, the semiconductor substrate is transferred from a dry process element in the dry process stage to a wet cleaning element within the wet cleaning stage by way of a second load lock module configured to maintain a low pressure environment within the processing chamber the dry process element.

At act 608, a wet clean procedure is performed on the semiconductor substrate. In various embodiments, the wet cleaning procedure may include a RCA clean.

At act 610, a semiconductor substrate is transferred from the wet cleaning tool to an output wafer carrier. In some embodiments, the output wafer carrier is a front opening unified pod (FOUP).

It will be appreciate that as described herein, the term 'semiconductor substrate' may be any type of semiconductor body (e.g., silicon, SiGe, SOD such as a semiconductor wafer and/or one or more die on a wafer, as well as any other type of metal layer, device, semiconductor and/or epitaxial layers, etc., associated therewith.

It will be appreciated that equivalent alterations and/or modifications may occur to one of ordinary skill in the art based upon a reading and/or understanding of the specification and annexed drawings. The disclosure herein includes all such modifications and alterations and is generally not intended to be limited thereby.

In addition, while a particular feature or aspect may have been disclosed with respect to one of several implementations, such feature or aspect may be combined with one or more other features and/or aspects of other implementations as may be desired. Furthermore, to the extent that the terms "includes", "having", "has", "with", and/or variants thereof are used herein, such terms are intended to be inclusive in meaning—like "comprising." Also, "exemplary" is merely meant to mean an example, rather than the best. It is also to be appreciated that features, layers and/or elements depicted herein are illustrated with particular dimensions and/or orientations relative to one another for purposes of simplicity and ease of understanding, and that the actual dimensions and/or orientations may differ from that illustrated herein.

Therefore, the present disclosure relates to method and apparatus for performing a dry plasma procedure, while mitigating internal contamination of a semiconductor substrate.

In some embodiments, the present disclosure relates to a method of semiconductor processing. The method comprises transferring a first semiconductor substrate from a first input port in communication with an ambient environment to a first dry process element, and transferring a second semiconductor substrate from a second input port in communication with the ambient environment to a second dry process element. The method further comprises transferring the first and second semiconductor substrates from the first and second dry process elements to different input ports of a wet cleaning element configured to perform a wet cleaning process to remove contaminants from the first and second semiconductor substrates, and transferring the first and second semiconductor substrates directly from the wet cleaning element to an output port. The first and second semiconductor substrates are provided to the first and second dry process elements, respectively, prior to being transferred to the wet cleaning element.

In other embodiments, the present disclosure relates to a method of semiconductor processing. The method comprises transferring a first semiconductor substrate from a first input port in communication with an ambient environment to a first dry process element configured to perform a first dry plasma procedure on the first semiconductor substrate, and transferring a second semiconductor substrate from a second input port in communication with the ambient environment to a second dry process element configured to perform a second dry plasma procedure on the second semiconductor substrate. The method further comprises transferring the first and second semiconductor substrates from the first and second dry process elements to a wet cleaning element configured to perform a wet cleaning process to remove contaminants from the first and second semiconductor substrates, and transferring the first and second semiconductor substrates directly from the wet cleaning element to an output port different than the first input port and the second input port.

In yet other embodiments, the present disclosure relates to a method of semiconductor processing. The method comprises providing semiconductor substrates to a plurality of dry process elements configured to perform a dry plasma procedure on a received semiconductor substrate, wherein each of the plurality of dry process elements is connected to an input port in communication with an ambient environment by one of a plurality of first factory interfaces. The method further comprises transferring the semiconductor substrates from the dry process elements to a wet cleaning element configured to receive the semiconductor substrates from the plurality of dry process elements and to perform a wet cleaning process to remove contaminants from the semiconductor substrates. The method further comprises subsequently transferring the semiconductor substrates from the wet cleaning element to a second factory interface configured to transfer the semiconductor substrates between the wet cleaning element and an output port. The semiconductor substrates are transferred from the plurality of dry process elements to the wet cleaning element by way of a plurality of load lock modules, wherein each of the plurality of load lock modules directly couples one of the plurality of dry process elements to the wet cleaning element.

What is claimed is:

1. A method of semiconductor processing, comprising:
   transferring a first semiconductor substrate from a first input port in communication with an ambient environment to a first dry process element, having a first dry process chamber, by way of a first factory interface directly coupled to the first input port;
   transferring a second semiconductor substrate from a second input port in communication with the ambient environment to a second dry process element, having a second dry process chamber, by way of a second factory interface directly coupled to the second input port;
   transferring the first and second semiconductor substrates from the first and second dry process elements to different input ports of a housing of a wet cleaning element after operating the first dry process element on the first semiconductor substrate and operating the second dry process element on the second semiconductor substrate, wherein the wet cleaning element is configured to perform a wet cleaning process to remove contaminants from the first and second semiconductor substrates; and
   transferring the first and second semiconductor substrates from the wet cleaning element to an output port by way of a third factory interface directly coupled the output port, wherein the first dry process element is disposed between the first input port and the wet cleaning element, and the wet cleaning element is disposed between the first dry process element and the output port.

2. The method of claim 1,
wherein the first semiconductor substrate is transferred from the first dry process element to the wet cleaning element by way of a first load lock directly coupled between the first dry process element and the wet cleaning element; and
wherein the second semiconductor substrate is transferred from the second dry process element to the wet cleaning element by way of a second load lock directly coupled between the second dry process element and the wet cleaning element.

3. The method of claim 1, further comprising:
providing the first semiconductor substrate to a load lock module after removing the first semiconductor substrate from the first dry process element, and prior to transferring the first semiconductor substrate to the wet cleaning element.

4. The method of claim 1, further comprising:
performing a first dry plasma procedure to remove material from the first semiconductor substrate in the first dry process element, prior to transferring the first semiconductor substrate to the wet cleaning element.

5. The method of claim 4,
wherein the first semiconductor substrate is transferred from the first dry process element to the wet cleaning element by way of a first load lock module contacting a first side of the wet cleaning element;
wherein the second semiconductor substrate is transferred from the second dry process element to the wet cleaning element by way of a second load lock module contacting a second side of the wet cleaning element that opposes the first side of the wet cleaning element;
wherein the third factory interface is coupled to a third side of the wet cleaning element;
wherein a first line that is perpendicular to the first side of the wet cleaning element extends through the first load lock module, the wet cleaning element, and the second load lock module, and a second line that is perpendicular to the first line extends through the wet cleaning element and the third factory interface.

6. The method of claim 1,
wherein the first semiconductor substrate is transferred from the first input port to the wet cleaning element by way of a first path extending through the first factory interface; and
wherein the second semiconductor substrate is transferred from the second input port to the wet cleaning element by way of a second path extending through the second factory interface, the first path not extending through a same factory interface as the second path.

7. The method of claim 1,
wherein the first dry process element is coupled to the first input port by way of the first factory interface; and
wherein the second dry process element is coupled to the second input port by way of the second factory interface.

8. The method of claim 1,
wherein the first semiconductor substrate passes consecutively from the first input port, to the first dry process element, to the wet cleaning element, and to the output port along a first path; and
wherein the second semiconductor substrate passes consecutively from the second input port, to the second dry process element, to the wet cleaning element, and to the output port along a second path that does not overlap the first path.

9. The method of claim 1, wherein the first dry process element and the second dry process element respectively comprise a plurality of ashers.

10. A method of semiconductor processing, comprising:
transferring a first semiconductor substrate from a first input port in communication with an ambient environment to a first dry process element configured to perform a first dry plasma procedure on the first semiconductor substrate by way of a first factory interface coupled between the first input port and the first dry process element, wherein the first dry process element comprises a first process chamber;
transferring a second semiconductor substrate from a second input port in communication with the ambient environment to a second dry process element configured to perform a second dry plasma procedure on the second semiconductor substrate by way of a second factory interface directly coupled between the second input port and the second dry process element, wherein the second dry process element comprises a second process chamber;
transferring the first and second semiconductor substrates from the first and second dry process elements to a wet cleaning chamber of a wet cleaning element configured to perform a wet cleaning process to remove contaminants from the first and second semiconductor substrates;
transferring the first and second semiconductor substrates from the wet cleaning element to an output port by way of a third factory interface coupled between the wet cleaning element and the output port; and
wherein the first semiconductor substrate is transferred to the wet cleaning element along a first path extending through the first factory interface and the second semiconductor substrate is transferred to the wet cleaning element along a second path extending through the second factory interface, the first path not extending through a same factory interface as the second path.

11. The method of claim 10, further comprising:
performing the first dry plasma procedure to remove material from the first semiconductor substrate in the first dry process element prior to transferring the first semiconductor substrate to the wet cleaning element.

12. The method of claim 11, further comprising:
performing the wet cleaning process on the first semiconductor substrate after performing the first dry plasma procedure and prior to transferring the first semiconductor substrate to the output port.

13. The method of claim 10,
wherein the first semiconductor substrate is transferred from the first dry process element to the wet cleaning element by way of a first load lock module coupled to a first surface of the wet cleaning element; and
wherein the second semiconductor substrate is transferred from the second dry process element to the wet cleaning element by way of a second load lock module coupled to a second surface of the wet cleaning element that opposes the first surface of the wet cleaning element.

14. The method of claim 10, wherein the first input port and the wet cleaning element are arranged on different sides of the first dry process element, and the output port and the first dry process element are arranged on different sides of the wet cleaning element.

15. The method of claim 10, wherein the wet cleaning element is spatially between the first dry process element and the second dry process element.

16. The method of claim 10,
wherein the first dry process element is arranged between the first input port and the wet cleaning element along a first line; and
wherein the second dry process element is arranged between the second input port and the wet cleaning element along a second line that is perpendicular to the first line.

17. The method of claim 10, further comprising:
providing the first semiconductor substrate to a load lock module after removing the first semiconductor substrate from the first dry process element, and prior to transferring the first semiconductor substrate to the wet cleaning element.

18. A method of semiconductor processing, comprising:
providing semiconductor substrates to a plurality of dry process elements configured to perform a dry plasma procedure on a received semiconductor substrate, wherein the plurality of dry process elements respectively comprise a dry process chamber coupled to a dedicated one of a plurality of input ports by way of a dedicated one of a plurality of factory interfaces;
transferring the semiconductor substrates from the dry process elements to a wet cleaning element comprising a wet cleaning chamber, the wet cleaning element configured to receive the semiconductor substrates from the plurality of dry process elements and to perform a wet cleaning process to remove contaminants from the semiconductor substrates, wherein the dry process elements are respectively disposed between different ones of the plurality of input ports and the wet cleaning element;
subsequently transferring the semiconductor substrates directly from the wet cleaning element to an additional factory interface configured to directly transfer the semiconductor substrates to an output port, wherein the wet cleaning element is disposed between the dry process elements and the output port; and
wherein the semiconductor substrates are transferred from the plurality of dry process elements to the wet cleaning element by way of a plurality of different load lock modules, wherein a different load lock module couples each of the plurality of dry process elements to the wet cleaning element.

19. The method of claim 18,
wherein the semiconductor substrates comprise a first semiconductor substrate and a second semiconductor substrate;
wherein the first semiconductor substrate is transferred along a first path extending from a first input port to the wet cleaning element, the first path extending through a first factory interface having a first robotic arm and a first dry process element;
wherein the second semiconductor substrate is transferred along a second path extending from a second input port to the wet cleaning element, the second path extending through a second factory interface having a second robotic arm and not through the first factory interface; and
wherein the first and second input ports are upstream of the dry process elements.

20. The method of claim 19, wherein the first factory interface is directly coupled to the first input port and the second factory interface is directly coupled to the second input port.

* * * * *